United States Patent
Bucki et al.

(10) Patent No.: US 6,535,041 B1
(45) Date of Patent: Mar. 18, 2003

(54) STROBE CIRCUIT KEEPER ARRANGEMENT PROVIDING REDUCED POWER CONSUMPTION

(75) Inventors: Robert John Bucki, Cary, NC (US); Sang Hoo Dhong, Austin, TX (US); Jeffrey Herbert Fischer, Cary, NC (US); Joel Abraham Silberman, Somers, NY (US); Osamu Takahashi, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/093,440

(22) Filed: Mar. 7, 2002

(51) Int. Cl.[7] ................................................. H03K 3/12
(52) U.S. Cl. ........................ 327/199; 327/200; 365/203
(58) Field of Search ................................. 327/198–200, 327/215, 218, 219, 211, 212; 326/95, 98, 119, 121; 365/193, 203; 714/724, 726, 731

(56) References Cited

U.S. PATENT DOCUMENTS

| | | | | |
|---|---|---|---|---|
| 5,973,529 A | * | 10/1999 | Chappell et al. | 327/200 |
| 6,072,746 A | * | 6/2000 | Durham et al. | 365/230.06 |
| 6,326,814 B1 | * | 12/2001 | Stasiak et al. | 326/98 |
| 6,369,629 B1 | * | 4/2002 | Sato | 327/203 |

* cited by examiner

Primary Examiner—Terry D. Cunningham
Assistant Examiner—Long Nguyen
(74) Attorney, Agent, or Firm—Casimer K. Salys; Russell D. Culbertson; Shaffer & Culbertson, L.L.P.

(57) ABSTRACT

A dynamic node keeper device for a dynamic strobe circuit is controlled by the signal at the intermediate node, that is, the signal at the output of the strobe component. By controlling the dynamic node keeper device through the strobe component output, the keeper device is active or conductive only when necessary to protect against noises in the pull down network for the strobe circuit. At all other times in the course of operation of the dynamic strobe circuit, the dynamic node keeper device according to the invention is nonconductive or inactive. Thus, the dynamic strobe circuit according to the invention reduces power consumption.

17 Claims, 3 Drawing Sheets

STROBE CIRCUIT KEEPER ARRANGEMENT PROVIDING REDUCED POWER CONSUMPTION

TECHNICAL FIELD OF THE INVENTION

This invention relates to dynamic strobe circuits used in data processors to implement logical functions. A dynamic strobe circuit according to the invention includes an improved dynamic node keeper arrangement that reduces power consumption without significantly affecting circuit performance.

BACKGROUND OF THE INVENTION

Dynamic strobe circuits are widely used in data processors because of their speed advantage in implementing logical AND functions utilizing a large number of inputs, commonly referred to as "wide" AND functions. In particular, dynamic strobe circuits are used in decoders, programmable logic arrays, address comparators, and adders. These processor components or macros are major components of the processor and some are used repeatedly in a single processor.

FIG. 1 illustrates a typical prior art dynamic strobe circuit 100. This prior art dynamic strobe circuit includes a dynamic node 101 connected to a precharge device 102 comprising a P-type field effect transistor ("FET"). Dynamic node 101 is also connected to a number of the pull-down devices 103, each comprising a N-type FET. Dynamic strobe circuit 100 also includes a strobe component 104 made up of a P-type FET 105, a N-type FET 106, and an input device 107 which comprises a N-type FET. Devices 105 and 106 each receive a strobe signal S at their respective gate, while input device 107 receives the signal present on dynamic node 101. The signal at the dynamic node represents the input to strobe component 104, while the output of the strobe component is taken at the junction between P-type device 105 and input device 107. This strobe component output is connected to an intermediate node or strobe dynamic node 108. The signal at intermediate node 108 is inverted by inverter 109 and applied as the output of the dynamic strobe circuit at circuit output node 110. This output signal is fed back to control an output keeper device, P-type FET 111.

The prior art strobe circuit shown in FIG. 1 includes a keeper arrangement 112 for dynamic node 101. This prior art keeper arrangement 112 includes an inverter 114 connected to receive the signal at dynamic node 101, and to apply the inverted signal to control a keeper device, P-type FET 115. A drawback of this prior art keeper arrangement 112 is that keeper device 115 is on or active any time dynamic node 101 is at a logical high voltage level. Thus, keeper device 115 is normally conductive and dissipating power, even during the precharge period.

SUMMARY OF THE INVENTION

A dynamic strobe circuit according to the invention includes an improved dynamic node keeper arrangement. The improved dynamic node keeper arrangement includes a keeper device that is controlled by the signal at the intermediate node, that is, the signal at the output of the strobe component. By controlling the dynamic node keeper device through the strobe component output, the keeper device is active or conductive only when necessary to protect against noises in the pull-down network. At all other times in the course of operation of the dynamic strobe circuit, the dynamic node keeper device according to the invention is nonconductive or inactive. Thus, the dynamic strobe circuit according to the invention reduces power consumption. The present dynamic node keeper arrangement also eliminates the inverter required to provide the control signal in the prior art keeper arrangement, and thus reduces the number of devices in the circuit. These benefits are obtained without any significant impact on circuit performance.

The invention includes a method for controlling the dynamic node of a dynamic strobe circuit to decrease power consumption in the circuit. The method includes first precharging the dynamic node of the circuit during a precharge period, and then selectively connecting the dynamic node to the supply voltage through the keeper device in response to, or under the control of, the strobe component output. Controlling the dynamic node keeper device by the strobe component output ensures that the keeper device is in its conductive state, and thus dissipating power, only when necessary to protect the dynamic node from spurious signals to the draw-down devices.

These and other objects, advantages, and features of the invention will be apparent from the following description of the preferred embodiments, considered along with the accompanying drawings.

DESCRIPTION OF THE PREFERRED EMBODIMENTS

Figure 2:
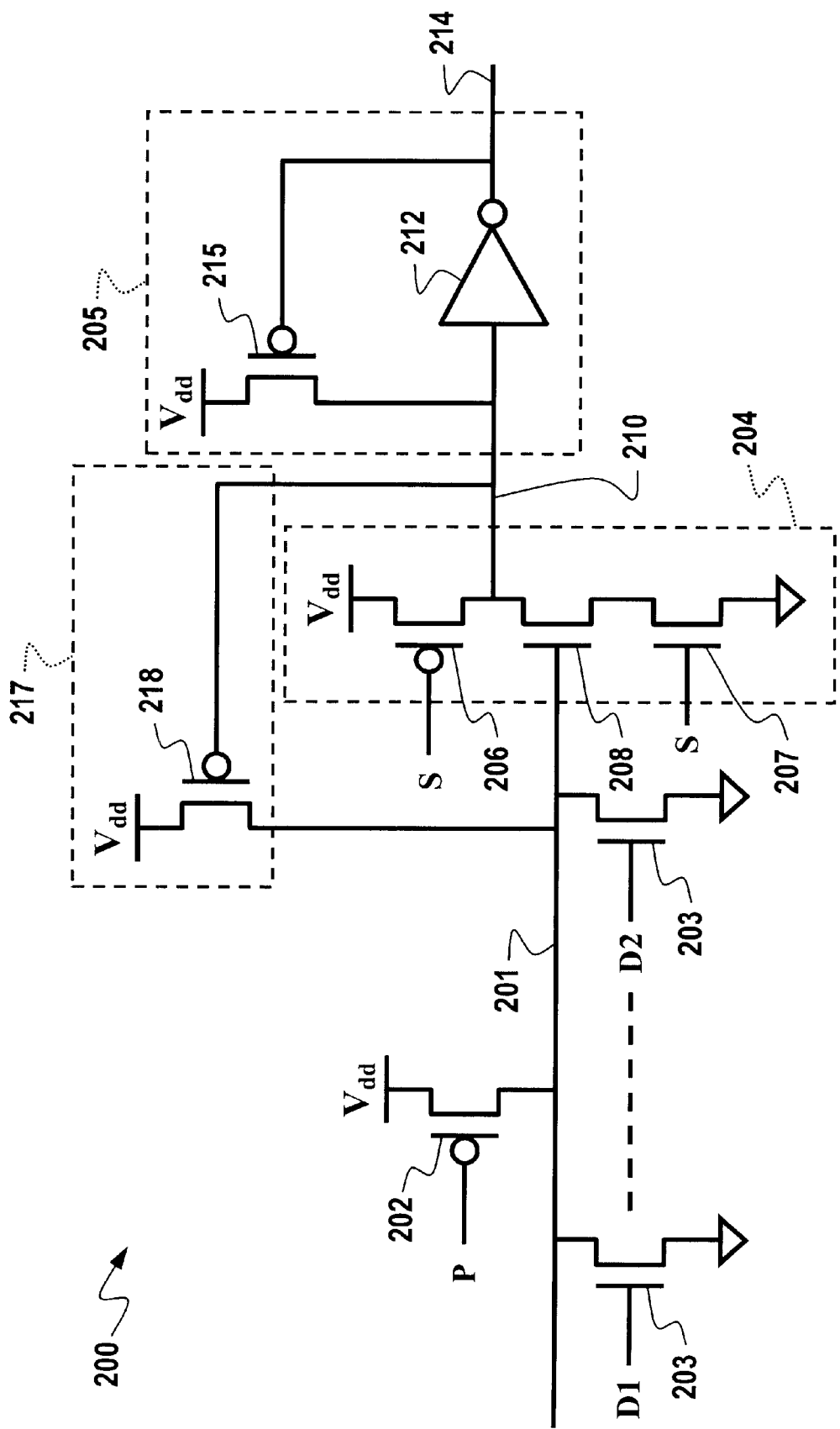
FIG. 2 is an electrical schematic diagram of a dynamic strobe circuit embodying the principles of the invention.

Referring to FIG. 2, a strobe circuit 200 embodying the principles of the invention includes a dynamic node 201 connected to a precharge device 202 comprising a P-type FET. Precharge device 202 has its conduction path, that is, its source-drain conduction path, connected between a supply voltage $V_{dd}$ and the dynamic node, and is controlled by a precharge signal P applied to the gate of the device. Dynamic node 201 is also connected to a plurality or number of pull-down devices 203, each comprising a N-type FET. Each pull-down device 203 has its respective conduction path connected between a reference voltage and dynamic node 201.

Strobe circuit 200 also includes a strobe component 204 and an output component 205. Strobe component 204 includes a first device 206 comprising a P-type FET, a second device 207 comprising a N-type FET, and an input device 208 comprising a N-type FET. The gate of input device 208 represents the input of strobe component 204, and is connected to receive the signal at dynamic node 201. First device 206 has its conduction path connected between the supply voltage $V_{dd}$ and an intermediate node or strobe dynamic node 210, second device 207 has its conduction path connected to the reference voltage, and input device 208 has its conduction path connected between the second device and intermediate node 210. The common point (intermediate node 210) between first device 206 and input device 208 represents the strobe component output. P-type device 206 and N-type device 207 are both connected to receive a strobe signal S at their respective gate electrode.

Output component 205 includes an inverter 212 connected to receive the signal at intermediate node 210 as its input, invert the signal, and apply the inverted signal to circuit output node 214. The signal at circuit output node 214 represents the output of strobe circuit 200. Output component 205 further includes an output keeper device 215 comprising a P-type FET. This output keeper device 215 has its conduction path connected between the supply voltage $V_{dd}$ and intermediate node 210. The circuit output signal at node 214 is applied to the gate or control input of output keeper device 215 to control the state of the device.

Figure 1:
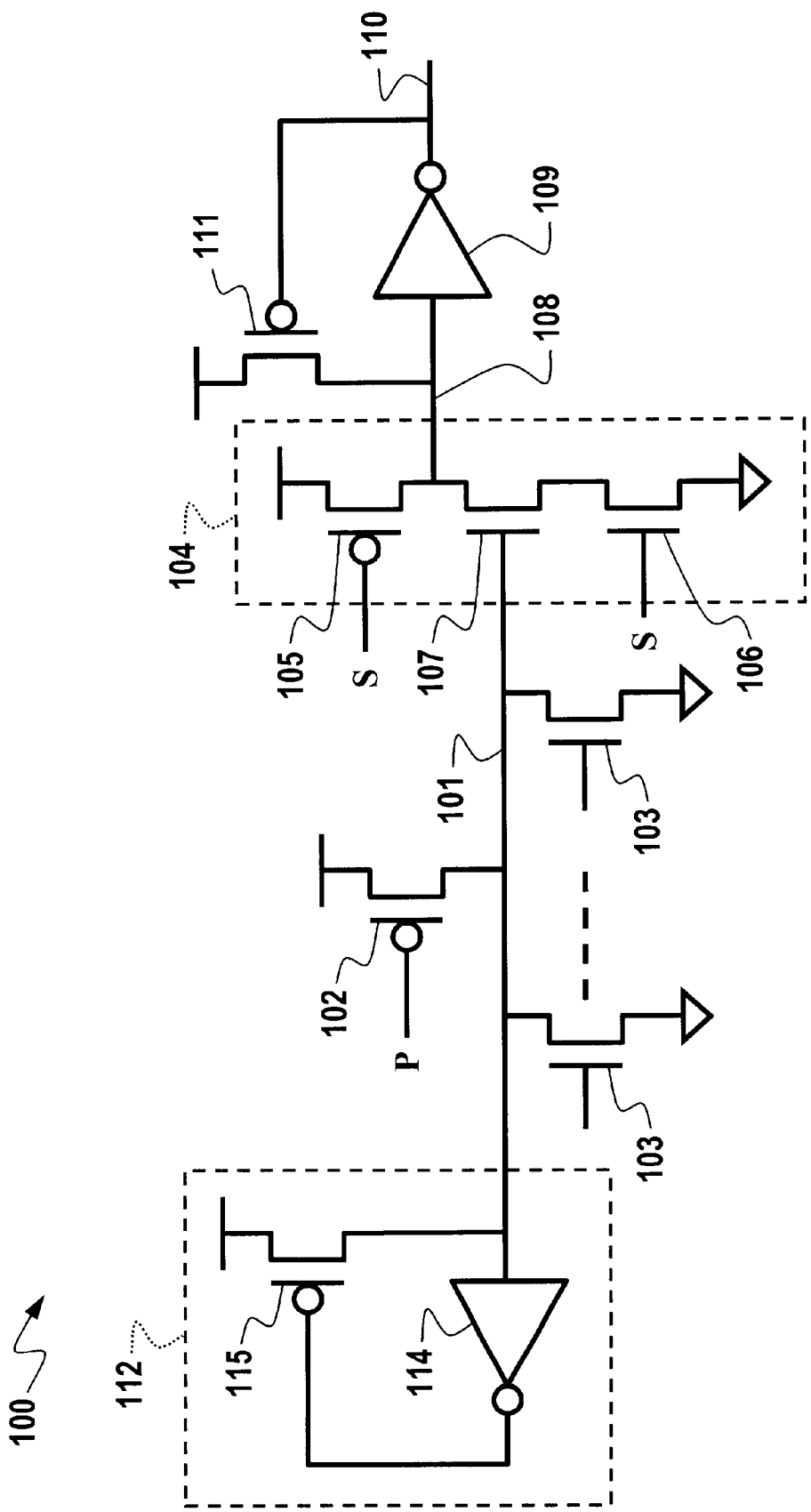
FIG. 1 is an electrical schematic diagram of a prior art dynamic strobe circuit.

As described thus far, the dynamic strobe circuit shown FIG. 2 is similar to the prior art circuit shown FIG. 1. However, in contrast to the prior art dynamic node keeper arrangement shown in FIG. 1, strobe circuit 200 includes a dynamic node keeper arrangement 217 controlled through the signal at the strobe component output/intermediate node 210. Keeper arrangement 217 according to the invention includes a dynamic node keeper device 218 comprising a P-type FET having its conduction path connected between the circuit supply voltage $V_{dd}$ and dynamic node 201. Unlike the keeper device 115 shown in FIG. 1, the gate or control input to dynamic node keeper device 218 pursuant to the present invention is connected to intermediate node 210, that is, the strobe component output. A comparison of the prior art circuit shown in FIG. 1 and the present invention shown FIG. 2 will also show that the present invention eliminates the inverter 114 required in the prior art circuit for producing a control signal for keeper device 115. Thus, the present dynamic node keeper arrangement reduces the number of devices required by the strobe circuit.

The operation of strobe circuit 200 may be described with reference to the circuit diagram of FIG. 2 and to the signal timing chart shown in FIG. 3. The following discussion of the operation of strobe circuit 200 will refer to "high" level and "low" level signals at various points in the circuit. These high and low level signals represent logic levels in the circuit. For example, a high level signal may represent a logical value "1" while a low level signal may represent the opposite logical value "0". It will be appreciated that the invention is not limited to any particular values of high and low level signals. The actual range of signal values that represents a high level signal or a low level signal will depend upon the technology in which the circuit is implemented. The invention is intended to encompass any such implementation.

Figure 3:
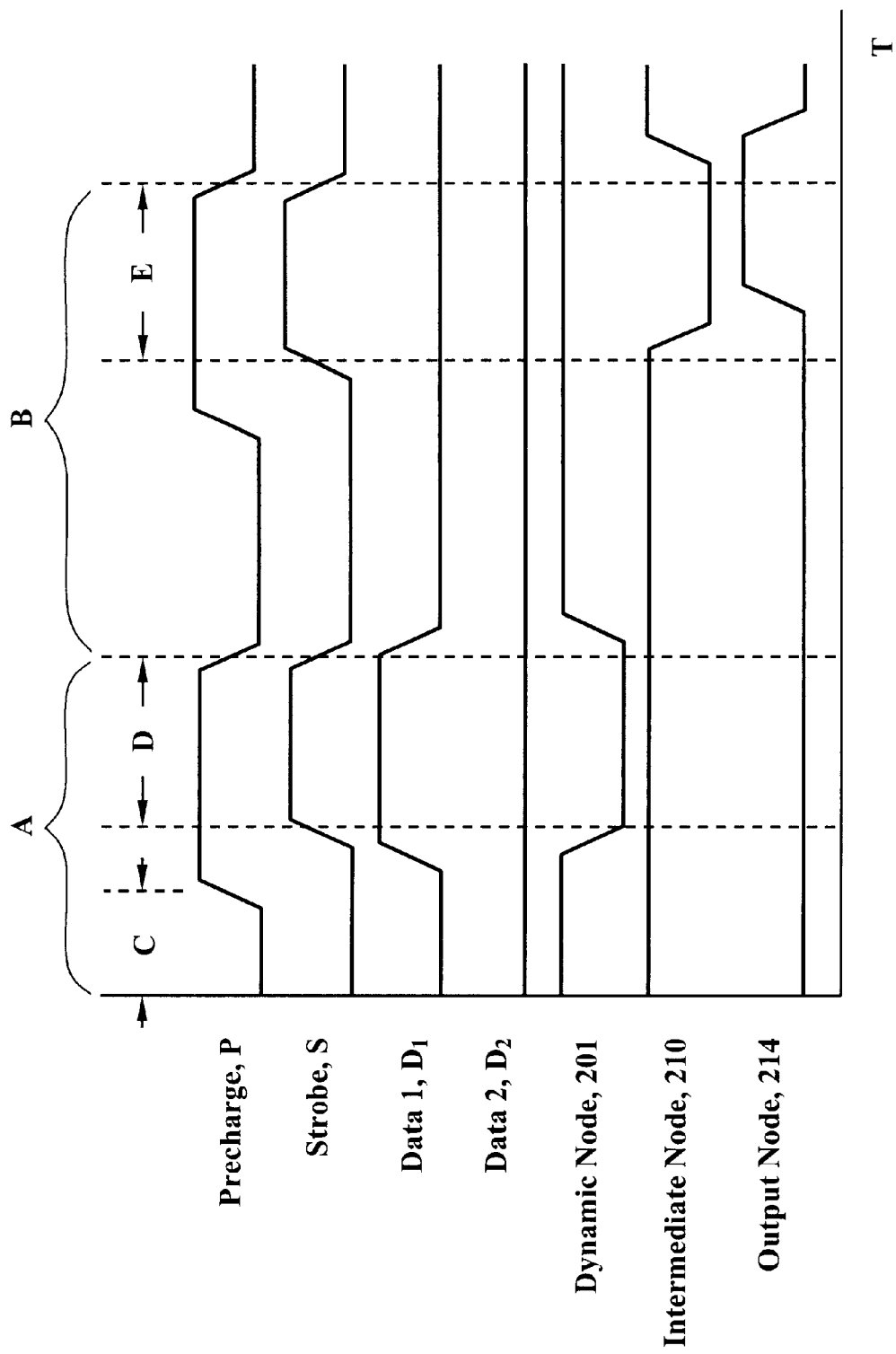
FIG. 3 is a timing chart showing the relative timing of signals in the circuit shown in FIG. 2.

The timing chart shown in FIG. 3 assumes only two data input signals D1 and D2, each to a different pull-down device 203. These two data signals are sufficient for describing the present invention. However, it will be appreciated that the invention is not limited to any particular number of data input signals to the network of pull-down devices 203. In many applications of the invention, there will be many data inputs for the particular logical function required of the circuit.

FIG. 3 shows generally two separate cycles of dynamic strobe circuit 200. The first cycle is shown over time A, while the second cycle is shown over time B. The data shown for purposes of example in cycle A comprise a high level signal D1 and a low level signal D2. The data shown in cycle B comprise a low level signal D1 and a low level D2.

At the beginning of cycle A, shown generally at time C in FIG. 3, the gate of precharge device 202 receives a low level precharge signal P to activate the precharge device and connect dynamic node 201 to the supply voltage. This connection precharges the dynamic node to the supply voltage level $V_{dd}$. It will be noted that the input signals to pull-down devices 203 are held low during this precharge period. It will also be noted that the strobe signal S to strobe component 204 is held to a low level during the precharge period so as to activate or turn on first device 206 and deactivate or turn off second device 207. The low level or inactive strobe signal S has the effect of precharging intermediate node 210 to the supply voltage level through P-type first device 206 to produce a high level signal at the intermediate node. This high level signal is inverted by inverter 212 to produce a low level output signal at circuit output node 214 during the precharge period. The low level output signal is fed back to activate or turn on output keeper device 215 and hold the high level signal at intermediate node 210. It will be noted that during this precharge period, the high level signal at intermediate node 210 is applied to the gate of dynamic node keeper device 218 to maintain the keeper device in its inactive, nonconductive state.

The data signals D1 and D2 in cycle A appear at their respective pull-down devices 203 in a period time between the precharge period C and the evaluation period D. The high-level signal D1 at one of the pull-down devices 203 causes the device to become active or conductive and this allows dynamic node 201 to discharge to the low level, reference voltage. It will be appreciated that a high level signal to any of the pull-down devices 203 in strobe circuit 200 will activate the respective device and cause dynamic node 201 to discharge or pull down to the low logical level, regardless of the signals applied to the other pull-down devices 203.

Some time after the data signals D1 and D2 arrive at the inputs to the respective pull-down devices 203, strobe signal S becomes active high to begin evaluation period D. The high level or active strobe signal S deactivates P-type device 206 and activates device N-type device 207 in strobe component 204. In this condition, the signal at dynamic node 201, that is, the input to strobe component 204, controls the state of the strobe output signal applied at intermediate node 210. If dynamic node 201 carries a high level signal at the time strobe signal S goes high, both input device 208 and second device 207 will be conductive and intermediate node 210 may discharge to a low signal level. However, if dynamic node 201 carries a low signal level when strobe signal S goes high as shown in cycle A in FIG. 3, the precharge at intermediate node 210 will be unable to discharge, maintaining a high signal level which results in low signal level output signal from the circuit at node 214.

Referring to the strobe circuit cycle indicated at time B in FIG. 3, the data signals applied to pull-down devices 203 are all low level signals. This allows dynamic node 201 to remain at a high signal level, substantially at $V_{dd}$. With the high level signal at dynamic node 201, when strobe signal S becomes active high for evaluation period E, intermediate node 210 will discharge to a low signal level through N-type input device 208 and N-type device 207. The low signal level at intermediate node 210 is inverted by inverter 212 to produce a high signal level at output node 214.

The low level signal at intermediate node 210 causes dynamic node keeper device 218 to become active or conductive and thus apply supply voltage $V_{dd}$ to dynamic node 201, thereby helping to maintain a high signal level state at the dynamic node. After evaluation period E, the low level strobe signal again activates P-type device 206 and deactivates N-type device 207. This once again charges intermediate node 210 to the supply voltage level, and this high level signal at the intermediate node deactivates dynamic node keeper device 218.

Dynamic node keeper device 218 according to the invention is active only during an evaluation period which commences at a time when dynamic node 201 is at a high signal level. During this period of time it is helpful to apply the supply voltage through dynamic node keeper device 218 in order to prevent spurious signals on the data lines to devices 203 from causing dynamic node 201 to discharge unintentionally. At all other times in the operation of dynamic strobe circuit 200, dynamic node 201 is either being precharged or the data at pull-down devices 203 dictates that the dynamic node reside at a low signal level. In the former case, there is no need for the keeper device to be operational, and in the latter case the keeper device must be inactive in order to prevent interference with the received data. By keeping dynamic node keeper device 218 normally inactive or off, and active only when necessary to protect the dynamic node from spurious signals on the data lines, the invention reduces the times during which current flows through the device, and thus reduces the power consumption of the circuit. This benefit is obtained with no significant impact on circuit performance. Also, as noted above by comparing the circuit diagrams of FIGS. 1 and 2, the keeper arrangement 217 according to the invention reduces the number of devices in the circuit.

The above described preferred embodiments are intended to illustrate the principles of the invention, but not to limit the scope of the invention. Various other embodiments and modifications to these preferred embodiments may be made by those skilled in the art without departing from the scope of the following claims.

What is claimed is:

1. A strobe circuit including:
    (a) a dynamic node connected to a precharge device and to a plurality of pull-down devices;
    (b) a strobe component for controlling the state of an intermediate node in response to the state of the dynamic node and a strobe signal; and
    (c) a keeper arrangement connected to be controlled by the signal at the intermediate node, the keeper arrangement for connecting the dynamic node to a supply voltage in response to a first signal level at the intermediate node.

2. The strobe circuit of claim 1 wherein the keeper arrangement includes a P-type field effect transistor having its gate connected to the intermediate node and its conduction path connected between the supply voltage and the dynamic node.

3. The strobe circuit of claim 2 wherein the strobe component includes:
    (a) a first device having a conduction path connected between the supply voltage and the intermediate node, and having a control input connected to receive the strobe signal;
    (b) a second device having a conduction path connected to a reference voltage, and having a control input connected to receive the strobe signal; and
    (c) an input device having a control input which represents the data input for the strobe component, and further having a conduction path connected between the intermediate node and the conduction path of the second device.

4. The strobe circuit of claim 1 wherein each pull-down device comprises an N-type field effect transistor having its conduction path connected between the dynamic node and a reference voltage.

5. An electronic circuit including:
    (a) a dynamic node connected to a precharge device and to a plurality of pull down devices;
    (b) a strobe component including a data input connected to the dynamic node and a data output connected to an intermediate node, the strobe component residing alternatively in an active condition in response to a strobe input signal or an inactive condition;
    (c) an output component connected between the intermediate node and a circuit output node; and
    (d) a dynamic node keeper device having a control input connected to the intermediate node and a conduction path connected between a supply voltage and the dynamic node.

6. The circuit of claim 5 wherein the output component comprises an inverter circuit having an inverter input connected to the intermediate node and an inverter output connected to the circuit output node.

7. The circuit of claim 6 further including an output keeper device having a control input connected to the circuit output node and having a conduction path connected between the supply voltage and the intermediate node.

8. The circuit of claim 5 wherein the strobe component includes:
    (a) a first device having a conduction path connected between the supply voltage and the data output of the strobe component, and having a control input connected to receive the strobe signal;
    (b) a second device having a conduction path connected to a reference voltage, and having a control input connected to receive the strobe signal; and
    (c) an input device having a control input which represents the data input for the strobe component, and further having a conduction path connected between the data output of the strobe component and the conduction path of the second device.

9. The circuit of claim 5 wherein the precharge device comprises a P-type field effect transistor having its conduction path connected between the supply voltage and the dynamic node.

10. The circuit of claim 5 wherein each pull down device comprises an N-type field effect transistor having its conduction path connected between the dynamic node and a reference voltage.

11. In a dynamic strobe circuit having a dynamic node precharged through a precharge device and connected to a pull-down network, and further having an intermediate node controlled through a strobe component receiving the signal at the dynamic node and a strobe signal, the improvement comprising:
    (a) a dynamic node keeper device having a control input connected to the intermediate node and a conduction path connected between a supply voltage and the dynamic node.

12. The dynamic strobe circuit of claim 11 wherein the keeper device comprises a P-type field effect transistor.

13. A method for controlling the dynamic node of a dynamic strobe circuit, the method including steps of:
    (a) precharging the dynamic node during a precharge period; and
    (b) applying a keeper voltage to the dynamic node during an evaluation period in response to a strobe component output controlled by a strobe signal and the signal at the dynamic node.

14. The method of claim 13 wherein the step of applying the keeper voltage includes applying a signal at the strobe component output to a control input of a dynamic node keeper device.

15. The method of claim 13 wherein the strobe component includes a first device having a conduction path connected between the supply voltage and the strobe component output, a second device having a conduction path connected to a reference voltage, and an input device having a control input connected to the dynamic node and a conduction path connected between the strobe component output and the conduction path of a second device, and further including the step of controlling the strobe component by applying the strobe signal to a control input for the first device and to a control input for the second device.

16. The method of claim 13 further including the step of applying input data to the dynamic strobe circuit through a plurality of pull down devices prior to the evaluation period, each pull down device having a conduction path connected between the dynamic node and a reference voltage.

17. The method of claim 13 wherein the step of precharging the dynamic node comprises applying a precharge signal to a control input of a precharge device to place the precharge device in an active condition.

* * * * *